(12) United States Patent
Mok

(10) Patent No.: US 11,058,009 B2
(45) Date of Patent: Jul. 6, 2021

(54) COMPONENT CARRIER COMPRISING A PHOTO-IMAGEABLE DIELECTRIC AND METHOD OF MANUFACTURING THE SAME

(71) Applicant: AT&S Austria Technologie & Systemtechnik Aktiengesellschaft, Leoben (AT)

(72) Inventor: Jeesoo Mok, Chongqing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 47 days.

(21) Appl. No.: 16/689,511

(22) Filed: Nov. 20, 2019

(65) Prior Publication Data
US 2020/0163218 A1     May 21, 2020

(30) Foreign Application Priority Data
Nov. 20, 2018   (CN) .......................... 201811386322.9

(51) Int. Cl.
| H05K 3/02 | (2006.01) |
| H05K 3/46 | (2006.01) |
| H05K 3/00 | (2006.01) |
| H05K 3/40 | (2006.01) |
| H05K 1/11 | (2006.01) |
| H05K 1/05 | (2006.01) |
| H05K 1/02 | (2006.01) |
| H05K 1/18 | (2006.01) |
| G03F 7/26 | (2006.01) |
| G03F 7/20 | (2006.01) |

(52) U.S. Cl.
CPC ........... *H05K 3/027* (2013.01); *H05K 1/0204* (2013.01); *H05K 1/05* (2013.01); *H05K 1/115* (2013.01); *H05K 1/186* (2013.01); *H05K 3/007* (2013.01); *H05K 3/0026* (2013.01); *H05K 3/4038* (2013.01); *H05K 3/4644* (2013.01); *G03F 7/20* (2013.01); *G03F 7/26* (2013.01); *H05K 2203/107* (2013.01)

(58) Field of Classification Search
CPC .... H05K 3/027; H05K 3/4644; H05K 3/0026; H05K 3/4038; H05K 3/007; H05K 1/115; H05K 1/05; H05K 1/186; H05K 2203/107; H05K 3/4608
USPC ........................................................ 361/761
See application file for complete search history.

(56) References Cited

U.S. PATENT DOCUMENTS 4,566,186 A * 1/1986 Bauer .................. H05K 3/4664
29/830
5,993,945 A * 11/1999 Russell ............... H01L 21/4857
174/258

(Continued)

FOREIGN PATENT DOCUMENTS

CN            204144244 U        2/2015

*Primary Examiner* — Sherman Ng
(74) *Attorney, Agent, or Firm* — Robert A. Blaha; Smith Tempel Blaha LLC

(57) ABSTRACT

A method of manufacturing a component carrier is disclosed. The method includes forming a stack having at least one electrically conductive layer structure and/or at least one electrically insulating layer structure; patterning a front side of the stack using a first photo-imageable dielectric; and patterning a back side of the stack. A component carrier is also disclosed.

27 Claims, 4 Drawing Sheets

(56) References Cited

U.S. PATENT DOCUMENTS

| | | | |
|---|---|---|---|
| 6,204,456 B1* | 3/2001 | Lauffer | H05K 3/0094 |
| | | | 174/262 |
| 9,640,413 B2 | 5/2017 | Liang et al. | |
| 2006/0056213 A1 | 3/2006 | Lee et al. | |
| 2008/0198552 A1 | 8/2008 | Cho et al. | |
| 2018/0342788 A1* | 11/2018 | Lasiter | H01L 23/66 |
| 2019/0206781 A1* | 7/2019 | Aleksov | H01L 23/49838 |

* cited by examiner

COMPONENT CARRIER COMPRISING A PHOTO-IMAGEABLE DIELECTRIC AND METHOD OF MANUFACTURING THE SAME

CROSS-REFERENCE TO RELATED APPLICATION

This application claims the benefit of the filing date of Chinese Patent Application No. 201811386322.9 filed Nov. 20, 2018, the disclosure of which is hereby incorporated herein by reference.

TECHNICAL FIELD

Embodiments of the invention generally relate to a component carrier comprising a photo-imageable dielectric and to a method of manufacturing the same.

TECHNOLOGICAL BACKGROUND

An electronic device like a computing or communication device typically comprises at least one improved component carrier like a printed circuit board (PCB), an intermediate printed circuit board product or an IC-substrate, together with components configured in a way to enable the functionality of the electronic device. To further enhance interconnection properties as well as density of electronic connections of such a component carrier and to reduce its size and thickness, components can also be integrated within the component carrier by the so called embedded component packaging (ECP) technology developed by the applicant.

However, the ECP substrate which is embedded the functional chips needs a thermal management to facilitate smooth chip operation, and an additional process such as pre-baking to prevent the components movement after a first lamination and UV-bump to smoothly remove the adhesive tape for the core layer manufacturing. This becomes one of the causes of increased manufacturing costs. The thermal management of the core layer with the chips is an issue due to heat sources (chips), and the manufacturing process on the core layer with some embedded components may become complex.

SUMMARY

There may be a need to provide a component carrier and a method of manufacturing the same, by which a heat dissipation capacity is further enhanced and a manufacturing process is simplified.

In order to achieve the object defined above, a component carrier and to a method of manufacturing the same according to the independent claims are provided.

According to an exemplary embodiment of the invention, a method of manufacturing a component carrier, wherein the method comprises: forming a stack comprising at least one electrically conductive layer structure and/or at least one electrically insulating layer structure; patterning a front side of the stack using a first photo-imageable dielectric (PID); and patterning a back side of the stack.

The use of the first photo-imageable dielectric for the front side lamination simplifies the manufacturing process of pre-baking and UV-bump/UV-curing, and prevents embedded components from moving due to the photo curing reaction of the first photo-imageable dielectric during the exposure process. The lead-time of the core layer manufacturing using the first photo-imageable dielectric for the front side lamination is shortened. There is no need of a pre-baking process to prevent some embedded components from moving and of an UV-bump/UV-curing process for removing any adhesive tape. Beyond that, the first photo-imageable dielectric does not exhibit any skin effect in holes or vias so that the component carrier can advantageously be used in high-frequency applications.

According to another exemplary embodiment of the invention, a component carrier is provided, wherein the component carrier comprises: a stack comprising at least one electrically conductive layer structure and/or at least one electrically insulating layer structure; at least one hole with straight sidewalls on a front side of the stack; and at least one hole with tapering side-walls on a back side of the stack.

According to still another exemplary embodiment of the invention, a component carrier is provided, wherein the component carrier comprises: a stack comprising at least one electrically conductive layer structure and/or at least one electrically insulating layer structure; a cured patterned first photo-imageable dielectric on a front side of the stack; and at least one cone-shaped hole on a back side of the stack.

In all of these embodiments, the holes at the front side, which are usually formed as photos vias in the first photo-imageable dielectric, may have circular as well as non-circular shapes. The non-circular shapes include rectangular, triangular and cross shapes.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "hole" may particularly denote an open hole, a blind hole which is closed at the bottom or a closed hole which is completely filled or plated with a certain material, such as a resin or a metal.

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may consist of at least a layer of glass, Sil-icon (Si) or a photo-imageable or dry-etchable organic material like epoxy-based Build-Up films or polymer compounds like Polyimide, Polybenzoxazole, or Benzocyclobutene.

In an embodiment, the at least one electrically insulating layer structure comprises at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg particularly FR4 are usually preferred for rigid PCBs, other materials in particular epoxy-based Build-Up Film for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

In the following, further exemplary embodiments of the component carrier, the arrangement, the method of manufacturing a component carrier and the method of use will be explained.

In an embodiment, the patterning of the front side of the stack using a first photo-imageable dielectric (PID) comprises illumination with electromagnetic radiation through a mask, followed by developing of the illuminated first photo-imageable dielectric, followed in turn by a selective removal of either the illuminated portion or the non-illuminated portion of the developed first photo-imageable dielectric. The removal can be achieved by an etching chemistry. Advantageously, a formation of holes with different depths and shapes (circular as well as non-circular) can be achieved.

In an embodiment, the first photo-imageable dielectric is patterned for contacting embedded components having different distances between the front side and an upper main surface of the respective component. The depths of the holes as photo vias can be readily controlled.

In an embodiment, the method further comprises patterning the back side of the stack by laser drilling. Advantageously, the different depths of the holes and of the through-hole are readily controlled by a combination of illumination with electromagnetic radiation at the front side (photo via) and laser drilling at the back side (laser via). While the photo vias may have different depths, the laser vias may have the same depth but are produced more accurately under shorter processing times.

In an embodiment, a through-hole is composed of a first hole portion with straight sidewalls on the front side connected to a second hole portion with tapering sidewalls on the backside. The first hole portion can be a photo via, while the second hole portion can be a laser via.

In an embodiment, the patterning of the front side of the stack using the first photo-imageable dielectric (PID) comprises forming multiple holes on the front side with different vertical depths.

In an embodiment, the patterning of the back side of the stack comprises forming multiple holes on the back side with substantially the same vertical depth.

In an embodiment, the patterning of the front side of the stack using the first photo-imageable dielectric comprises forming multiple holes on the front side with different horizontal widths.

In an embodiment, the method further comprises forming a via, and/or a wire (e.g. a coax cable, which can be optionally embedded) in a hole or a via of the component carrier. Such a design can realize a "via in via" or "hole in hole" configuration in a PID material. In an embodiment, a circle is structured and a via is implemented in the circle.

Advantageously, a shielded via can be obtained similar to a coax cable. In a similar way, capacitors or coils can also be realized in the PID material, for example if a magnetic material (e.g. magnetic dielectric) is either implemented as an outer or an inner via. However, the core itself could also be made of a magnetic material. The shielded wires (vias) enable a signal transmission which is substantially interference-free.

In an embodiment, a metal core is provided, to which the first photo-imageable dielectric is applied. For the thermal management of a core layer with several chips, the metal core can be made of Copper, Aluminum, Nickel, Zinc, as these materials have a high thermal conductivity. In another embodiment, the metal core may be a metallized core which consists of a dielectric base which is covered by a metallic outer surface.

In an embodiment, the stack is formed to have a dielectric core with metallized sidewalls.

In an embodiment, forming the stack comprises forming a through-hole formed in the first photo-imageable dielectric on the front side, by a dielectric on the backside, and by laser processing from the backside. In a modified embodiment, the dielectric on the backside can be subjected to a photo processing, i.e. by a radiation of electromagnetic light, before or after the laser processing. In an embodiment, the dielectric on the backside is a thermal curing material or a second photo-imageable dielectric (PID). Thus, a first PID hole is formed at the front side and a second PID hole is formed at the backside, wherein the second PID hole is further processed by the laser.

In an embodiment, forming the stack comprises the steps of: providing a metal core; attaching a temporary carrier on a backside of the metal core; forming a first cavity and optionally a second cavity into the metal core; embedding a semiconductor chip and/or a passive component into the first cavity; applying the first PID on a front side of the metal core; patterning the first PID at the first cavity for contacting the embedded semiconductor chip and/or the passive component, and optionally at the second cavity, thereby forming holes on the front side; removing the temporary carrier from the backside of the metal core; applying a dielectric on a backside of the metal core; patterning the dielectric on the backside at the first cavity and optionally the second cavity, thereby forming holes on the back side; and plating or filling the holes by a metal.

In a modified embodiment, before patterning the dielectric on the backside at the first cavity, at least one metal layer is applied onto the backside of the core, the metal layer is patterned, and the dielectric is applied on the at least one patterned metal layer.

For example, a first one of the at least one metal layer can be applied by means of sputtering, whereupon at least one further metal layer is applied such as by a chemical copper deposition and/or subsequently a galvanic copper deposition. Alternatively, depending on the surface properties and condition of the core, the first one of the at least one metal layer can be applied by means of an electroless copper deposition.

In an embodiment, the component carrier further comprises a cured patterned second PID on the back side of the stack.

In an embodiment, the component carrier further comprises a metal core having a first cavity, in which a semiconductor chip and/or a passive component is accommodated.

In an embodiment, the component carrier further comprises a through-hole passing through the component carrier.

In an embodiment, a hole extends from the front side has sidewalls being at least partially covered with the cured first PID. Thereby, the metal core can be isolated from the hole.

In an embodiment, an inner surface of the hole and/or the through-hole is plated or filled by a metal. The through-hole can be a so called plated-through-hole (PTH).

DETAILED DESCRIPTION OF ILLUSTRATED EMBODIMENTS

Figure 1:
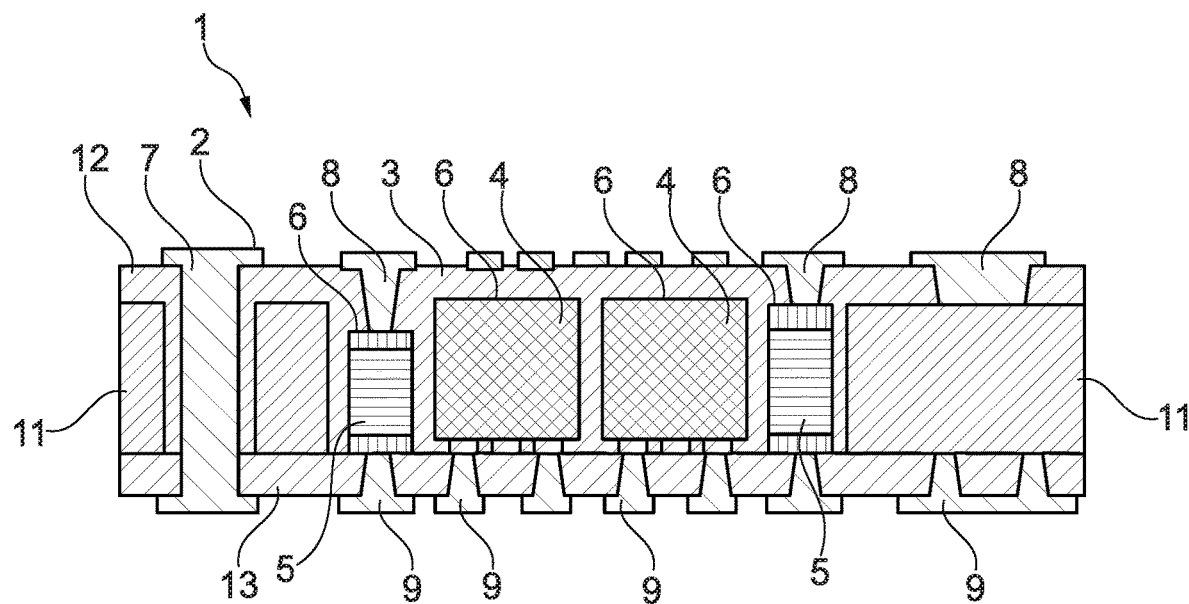
FIG. 1 illustrates a cross-sectional view of a preform of a component carrier being presently under manufacture according to an exemplary embodiment of the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment, a nano-coated structure may be used for component carrier technology, in particular as a dry-adhesive structure. An adhesive layer implementing such a surface configuration may also be denoted as gecko film. The adhesive effect of such a surface may be based on van der Waals forces. Descriptively speaking, a plurality of low dimensioned suction cups may be formed by such a concept. According to an exemplary embodiment of the invention, a reliable substrate and/or structured material is provided for embedding and/or surface mounting applications having specific adhesion properties due to a corresponding configuration of nano- and/or microstructures on this surface. Exemplary embodiments have the advantage that the mentioned adjustability of the surface adhesion properties may be obtained with low material consumption, low production costs, small contamination risk, and high process reliability.

In an embodiment, the mentioned materials may be used as support for component placement in embedding technologies. Compared to a traditional adhesive tape system that is dependent on temperature and time, an exemplary embodiment uses the surface of a support (which may be rigid or flexible) or PCB elements (such as cores, prepregs, copper foils, etc.), that exhibit, thanks to the nano- and/or microstructures, van der Waals attraction forces, a gecko effect, a high grip, and that are dry and thus can be cleaned and reused. A sheet with nano- and/or microstructures can also be included in the final product. When used for an embedding concept, components may be placed on the dry surface and can be held in position by weak bonds (like van der Waals forces, gecko effect, high grip values) prior to the component lamination.

Such an architecture allows to obtain a dry interaction between the component and the holding substrate. No additional liquid adhesive is required. This has the advantages of a dry interaction, and a reduction of risk of contamination from the substrate.

FIG. 1 illustrates a cross-sectional view of a preform of a component carrier 1 being presently under manufacture according to an exemplary embodiment of the invention.

The component carrier 1 comprises a stack comprising an electrically conductive layer structure 2 and an electrically insulating layer structure 3, holes 8 with straight sidewalls on a front side of the stack, and holes 9 with tapering or cone-shaped sidewalls on a back side of the stack. The component carrier 1 further comprises a through-hole 7 passing the component carrier 1.

The component carrier 1 further comprises a cured, patterned first photo-imageable dielectric 12 on the front side of the stack, in which the holes 8 at the front side of the stack are formed.

The through-hole 7 and the holes 8 extending from the front side have sidewalls being at least partially covered with the cured first photo-imageable dielectric 12 so that the same are insulated against a metal core 11. The first photo-imageable dielectric 12 also forms the electrically insulating layer structure 3.

An inner surface of the holes 8, 9 and the through-hole 7 is plated or filled by a metal, which can be copper. The metal also forms the electrically conductive layer structure 2.

The component carrier 1 further comprises the metal core 11 having cavities, in which semiconductor chips 4 and passive components 5 are accommodated.

Figure 2:
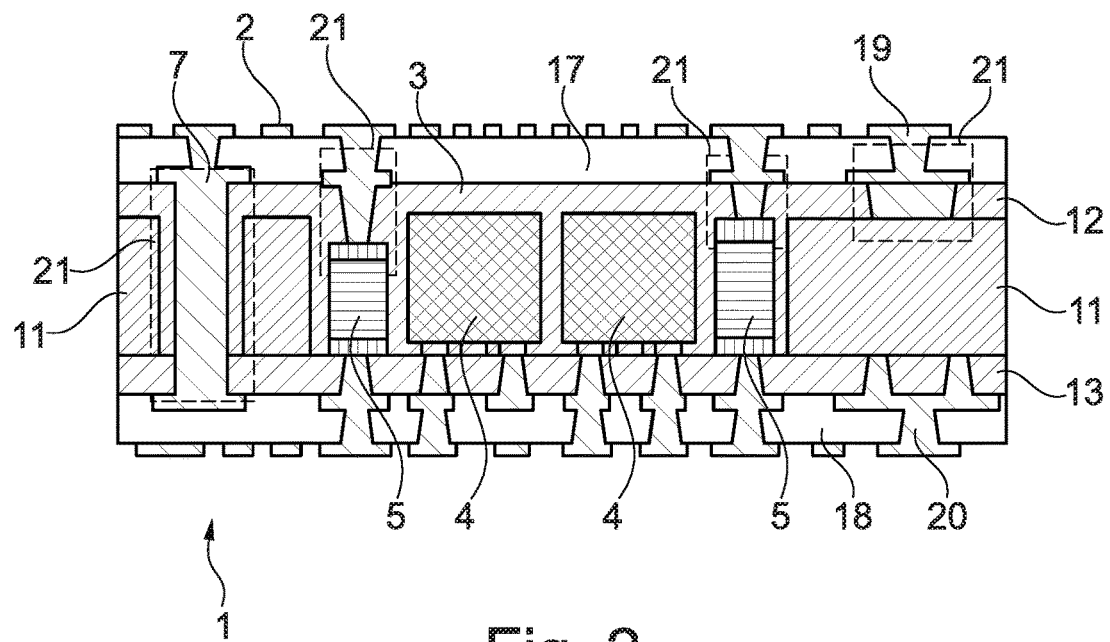
FIG. 2 illustrates a cross-sectional view of a preform of a component carrier being presently under manufacture according to the exemplary embodiment of the invention.

FIG. 2 illustrates a cross-sectional view of a preform of the component carrier 1 being presently under manufacture according to another exemplary embodiment of the invention. This embodiment is similar to the embodiment of FIG. 1; however, the embodiment of FIG. 2 is further manufactured in that additional electrically conductive and an electrically insulating layer structures 17, 18, 19, 20 are added. The dotted lines in FIG. 2 indicate heat dissipation areas 21, which are formed by the metal structures within the holes 8, 9 and the through-hole 7. At the same time, the holes 8, 9 and the through-hole 7 in the areas 21 have different depths which are readily controlled in the manufacturing process by a combination of illumination with electromagnetic radiation at the front side (photo via) and laser drilling at the back side (laser via) as described later. Further, the first photo-imageable dielectric 12 provides the electric insulation between the metal structures within the holes 7, 8, 9 on the one hand and the metal core 11 and the components 4, 5 on the other hand.

Figure 3:
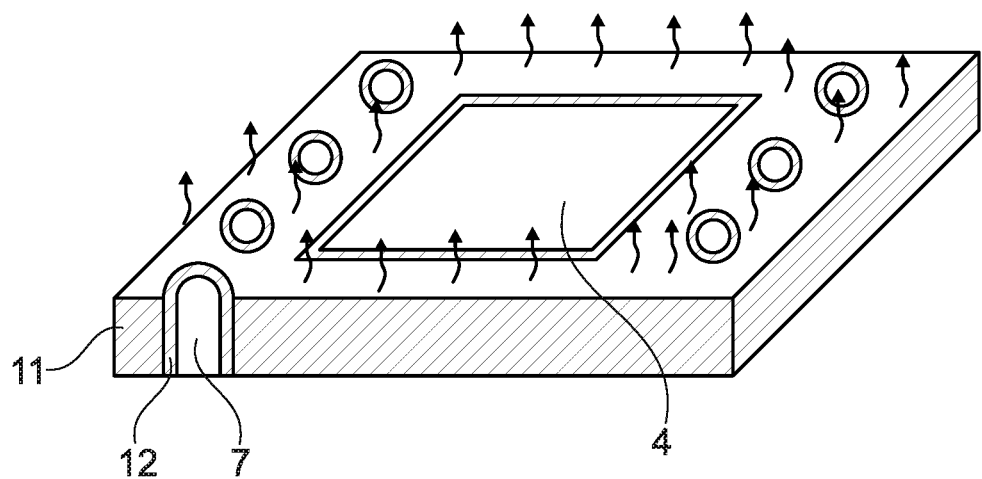
FIG. 3 illustrates a perspective view of a preform of a component carrier being presently under manufacture according to another exemplary embodiment of the invention.

FIG. 3 illustrates a perspective view of a preform of the component carrier 1 being presently under manufacture according to the exemplary embodiment of the invention.

The semiconductor chips 4 are embedded in the metal core 11. Heat, which is produced by the semiconductor chips 4, is dissipated by the metal core 11. FIG. 3 clearly shows the electrical insulation between the metal structures within the holes 7, 8, 9 on the one side and the metal core 11 and the semiconductor chip 4 on the other side. The heat dissipation from the heating source (semiconductor chips) 4 is improved by embedding the semiconductor chip 4 right into the center metal core 11 compared with conventional techniques where semiconductor chips are just arranged onto a metal support.

Figure 4:
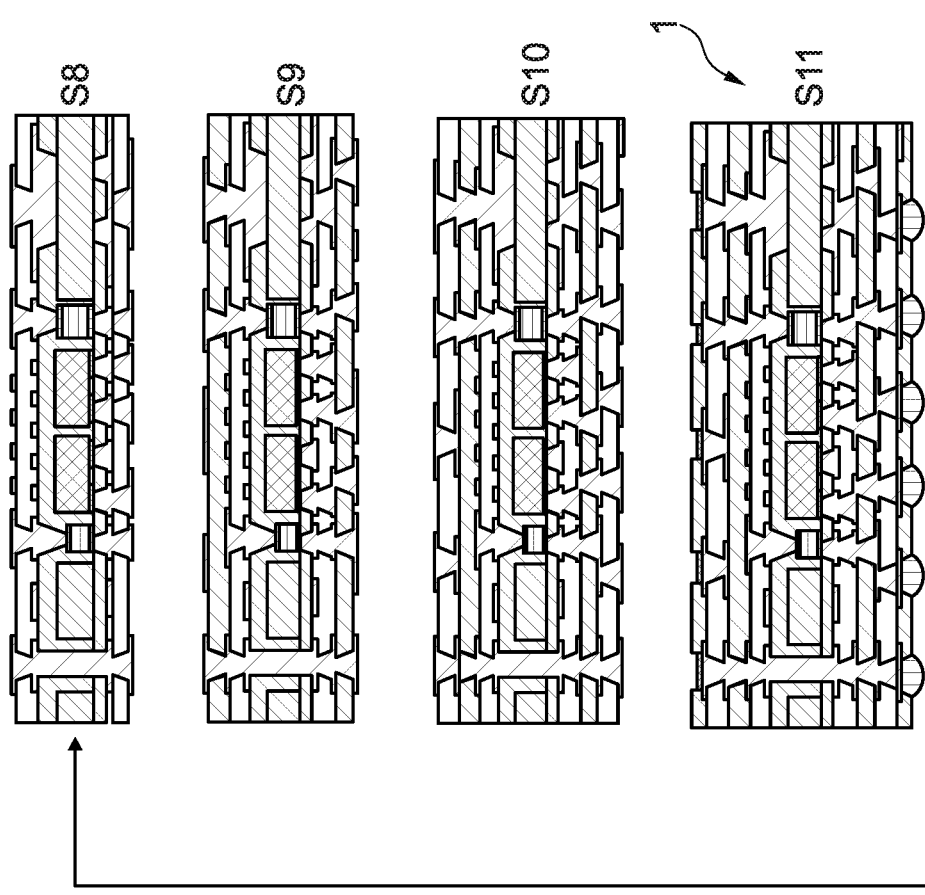
FIG. 4 illustrates a flow diagram of a method of manufacturing a component carrier according to another exemplary embodiment of the invention.
Figure 4:
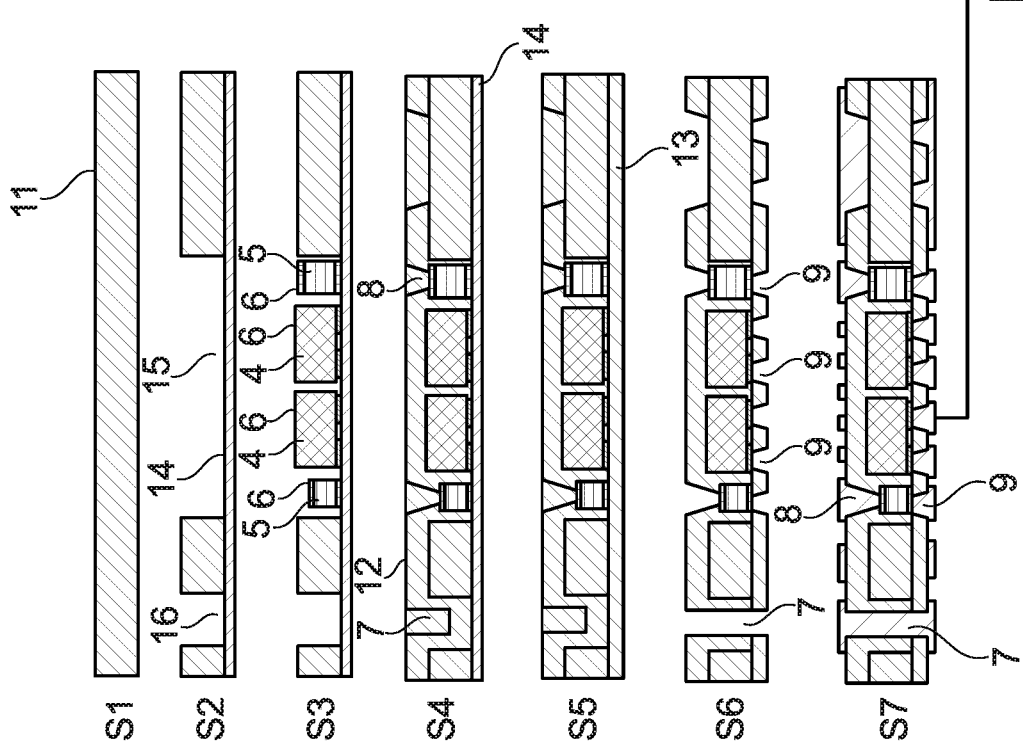

FIG. 4 illustrates a flow diagram of a method of manufacturing the component carrier 1 according to another exemplary embodiment of the invention.

In a step S1, a metal core 11 is provided, and in a step S2, a temporary carrier 14 is attached on a backside of the metal core 11. Further, a first cavity 15 and a second cavity 16 are formed into the metal core 11, for example by cutting or drilling or any other conventional technique.

In a step S3, semiconductor chips 4 and passive components 5 such as capacitors or resistors are embedded into the first cavity 15. The temporary carrier 14 holds the semiconductor chips 4 and the passive components 5 on their correct positions so that the same are not moved in the subsequent steps. The temporary carrier 14 can be an adhesive tape.

In a step S4, a first photo-imageable dielectric 12 is applied on a front side of the metal core 11, and the first photo-imageable dielectric 12 is patterned at the first cavity 15 for contacting the embedded semiconductor chip 4 and the passive component 5, and at the second cavity 16, thereby forming the holes 8 and the through hole 7 at the front side. The patterning of the first photo-imageable dielectric 12 can be made by illuminating the first photo-imageable dielectric 12 with electromagnetic radiation through a mask, followed by developing of the illuminated first photo-imageable dielectric 12, followed in turn by a selective removal of either the illuminated portion or the non-illuminated portion of the developed photo-imageable dielectric 12. The holes 7, 8 on the front side thus have straight sidewalls and are so called photo vias.

The first photo-imageable dielectric 12 forms the electrically insulating layer structure 3.

As shown in FIGS. 1 and 4, the multiple holes 8 on the front side are formed to have different vertical depths. The first photo-imageable dielectric 12 is patterned for contacting the embedded components 4, 5 having different distances between the front side of the stack and an upper main surface 6 of the respective components 4, 5. In detail, the upper main surface 6 of the passive component 5 located at the left-hand side in FIGS. 1 and 4 is lower than upper main surfaces 6 of the semiconductor chips 4 and the passive component 5 located at the right-hand side.

The multiple holes 8 on the front side can be formed to have different horizontal widths.

In a step S5, the temporary carrier 14 is removed or detaped from the backside of the metal core 11. Now, the first photo-imageable dielectric 12 holds the semiconductor chips 4 and the passive components 5 on their correct positions so that the same are not moved in the subsequent steps. Then, a second photo-imageable dielectric 13 is applied on the backside of the stack, i.e. on the backside of the metal core 11.

In a step S6, the second photo-imageable dielectric 13 is patterned on the backside at the first cavity 15 and the second cavity 16, thereby forming holes 9 and the through-hole 7 at the back side. The patterning of the back side of the stack can be made by laser drilling or laser processing so that the holes 7, 9 on the back side have tapering sidewalls. The holes 7, 9 on the back side are so called laser vias. The multiple holes 9 on the back side are formed to have substantially the same vertical depth.

In a step S7, the holes 7, 8, 9 are plated by a metal such as copper. The metal forms the electrically conductive layer structure 2.

In subsequent steps S8 through S11, the component carrier 1 is further built-up by additional layer structures similar to the additional layer structures 17, 18, 19, 20 in FIG. 2.

In an embodiment, the through-hole 7 can be composed of a first hole portion with straight sidewalls on the front side connected to a second hole portion with tapering sidewalls on the backside is formed. The first hole portion can be a photo via, while the second hole portion can be a laser via.

In an embodiment, a wire and/or a coax cable can be formed in a hole 7, 8, 9 or a via of the component carrier 1.

Figure 5:
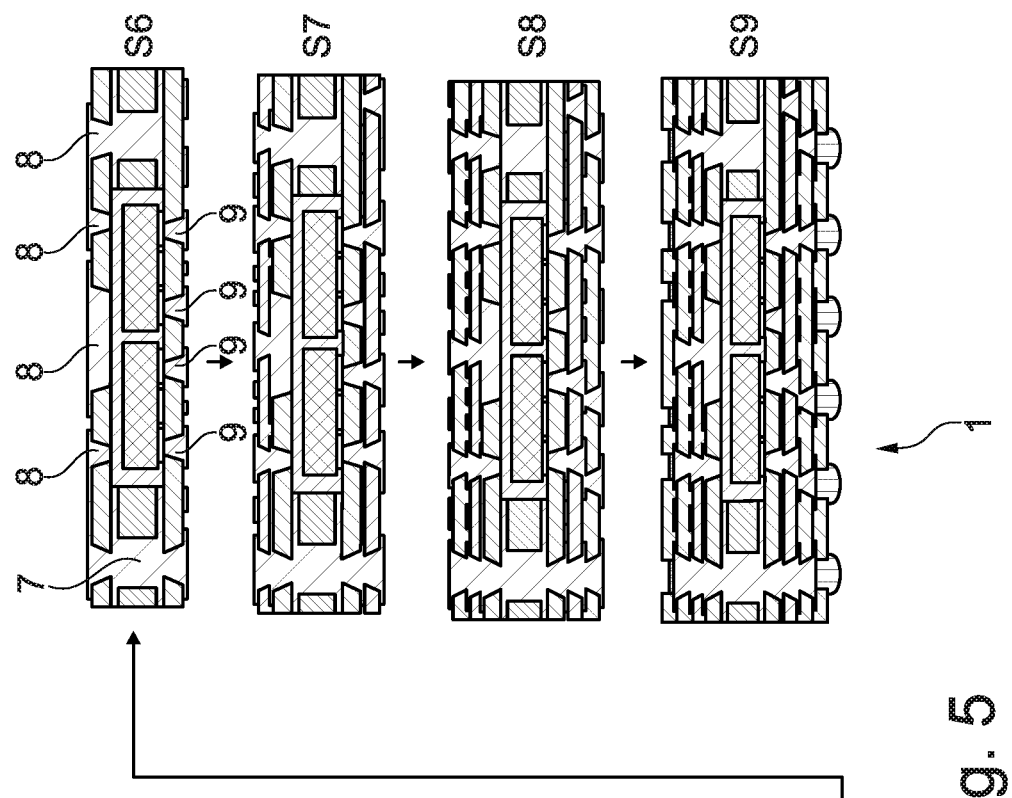
FIG. 5 illustrates a flow diagram of a method of manufacturing a component carrier according to another exemplary embodiment of the invention.
Figure 5:
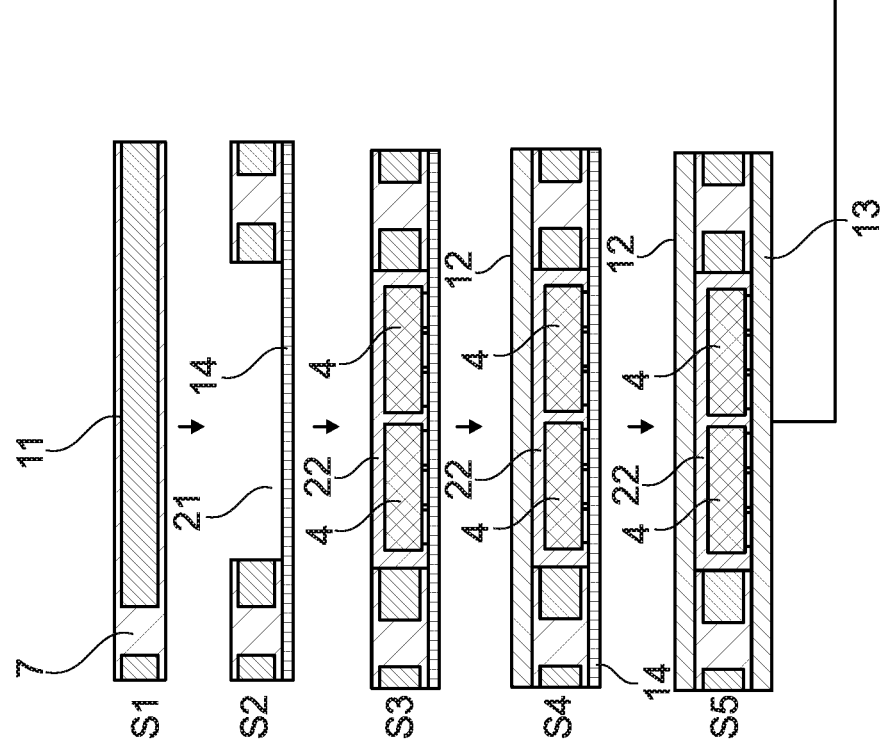

FIG. 5 illustrates a flow diagram of a method of manufacturing the component carrier 1 according to another exemplary embodiment of the invention.

In a step S1, a metal core 11 is provided and coated at the front side and at the back side by copper layers. The metal core 11 includes a through-hole 7, which is filled by the copper.

In a step S2, a temporary carrier 14 is attached on a backside of the metal core 11. The temporary carrier 14 is an adhesive tape which is laminated onto the metal core 11. Further, a cavity 21 is formed into the metal core 11.

In a step S3, two components 4, i.e. two semiconductor chips 4 are embedded into the cavity 21. The temporary carrier 14 holds the semiconductor chips 4 on their correct positions so that the same are not moved in the subsequent steps. Thereafter, the components 4, 4 are embedded into an encapsulant 22, for example by molding a resin having a high thermal conductivity.

In a step S4, the first photo-imageable dielectric 12 is applied to the front side of the stack and cured, and the temporary carrier 14 is removed or detaped. The first photo-imageable dielectric 12 holds the semiconductor chips 4, 4 on their correct positions so that the same are not moved in the subsequent steps.

In a step S5, a second photo-imageable dielectric 13 is applied to the back side of the stack and cured, so that the components 4, 4 are sandwiched between the first and second photo-imageable dielectrics 12, 13.

Thereafter, the first and second photo-imageable dielectrics 12, 13 are patterned, for example in a lithography process or in imaging and etching processes. The patterning of the first and second photo-imageable dielectrics 12, 13 may comprise illumination with electromagnetic radiation through a mask, followed by developing of the illuminated first and second photo-imageable dielectrics 12, 13, followed in turn by a selective removal of either the illuminated portion or the non-illuminated portion of the developed first and second photo-imageable dielectrics 12, 13. By the patterning process, vias 7, 8, 9 are formed, which consist of a through-hole 7, holes 8 at the front side and holes 9 at the back side of the stack.

Alternatively, the through-hole 7, the holes 8 at the front side and/or the holes 9 at the back side can be formed by laser drilling.

The multiple holes 8 on the front side may have different vertical depths. The first photo-imageable dielectrics 12 may be patterned for contacting the embedded components 4, 4 having different distances between the front side of the stack and an upper main surface of the respective components 4, 4.

The multiple holes 8 on the front side can be formed to have different horizontal widths.

The multiple holes 9 on the back side may be formed to have substantially the same vertical depth.

In a step S6, the vias 7, 8, 9, which are formed in the patterning process of the first and second photo-imageable dielectrics 12, 13, are plated or filled by a metal such as copper, thereby forming the electrically conductive layer structure 2.

In subsequent steps S7 to S9, additional electrically conductive and electrically insulating layer structures are added to the stack.

In an embodiment, the through-hole 7 can be composed of a first hole portion with straight sidewalls on the front side connected to a second hole portion with tapering sidewalls on the backside is formed. The first hole portion can be a photo via, while the second hole portion can be a laser via.

In an embodiment, a wire and/or a coax cable can be formed in the vias 7, 8, 9 of the component carrier 1.

The present invention offers the following advantages: heat dissipating is achieved by the metal core 11 with the holes 7, 8, 9, wherein the through-hole 7 can be a so called plated-through-hole (PTH); the holes 7, 8, 9 or vias can be formed with different depths to connect the passive and active components, for example as photo vias and laser vias; and there is no need of a step of pre-baking to prevent the components 4, 5 from moving during lamination by photo reaction of the first photo-imageable dielectric 12.

The present invention is applicable for ECP-manufactured mobile phones and related electronic devices. The present invention provides a functional ECP with improved heat dissipation and bio compatibility.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A method of manufacturing a component carrier, comprising:
    forming a stack comprising at least one electrically conductive layer structure and at least one electrically insulating layer structure;
    patterning a front side of the stack using a first photo-imageable dielectric;
    patterning a back side of the stack;
    providing a metal or metallized core;
    attaching a temporary carrier on a backside of the metal or metallized core;
    forming a first cavity into the metal or metallized core;
    embedding a semiconductor chip and/or a passive component into the first cavity;
    applying the first photo-imageable dielectric on a front side of the metal or metallized core;
    patterning the first photo-imageable dielectric at the first cavity for contacting the embedded semiconductor chip and/or the passive component, thereby forming holes on the front side;
    removing the temporary carrier from the backside of the metal or metallized core;
    applying a dielectric on a backside of the metal or metallized core;
    patterning the dielectric on the backside at the first cavity, thereby forming holes on the back side; and
    plating or filling the holes by a metal.

2. The method according to claim 1, wherein patterning the front side of the stack using a first photo-imageable dielectric comprises illumination with electromagnetic radiation through a mask, followed by developing of the illuminated first photo-imageable dielectric, followed in turn by a selective removal of either the illuminated portion or the non-illuminated portion of the developed first photo-imageable dielectric.

3. The method according to claim 1, wherein the first photo-imageable dielectric is patterned for contacting embedded components having different distances between the front side and an upper main surface of the respective component.

4. The method according to claim 1, further comprising: patterning the back side of the stack by laser drilling.

5. The method according to claim 1, wherein a through-hole composed of a first hole portion with straight sidewalls on the front side connected to a second hole portion with tapering sidewalls on the backside is formed.

6. The method according to claim 1, wherein patterning the front side of the stack using the first photo-imageable dielectric comprises forming multiple holes on the front side with different vertical depths.

7. The method according to claim 1, wherein patterning the back side of the stack comprises forming multiple holes on the back side with substantially the same vertical depth.

8. The method according to claim 1, wherein patterning the front side of the stack using the first photo-imageable dielectric comprises forming multiple holes on the front side with different horizontal widths.

9. The method according to claim 1, further comprising:
    forming a wire and/or a coax cable in a hole or a via or of the component carrier.

10. The method according to claim 1, wherein a metal or metallized core is provided, to which the first photo-imageable dielectric is applied.

11. The method according to claim 1, wherein forming the stack comprises forming a dielectric core with metallized sidewalls.

12. The method according to claim 1, wherein forming the stack comprises forming a through-hole formed by the first photo-imageable dielectric on the front side, by a dielectric on the backside, and by laser processing from the backside.

13. The method according to claim 12, wherein the dielectric on the backside is a thermal curing material or a second photo-imageable dielectric.

14. The method according to claim 1, wherein before patterning the dielectric on the backside at the first cavity, at least one metal layer is applied onto the backside of the metal or metallized core, the metal layer is patterned, and the dielectric is applied on the at least one patterned metal layer.

15. The method according to claim 1, further comprising:
    forming a second cavity into the metal or metallized core;
    patterning the first photo-imageable dielectric at the second cavity, thereby forming holes on the front side;
    patterning the dielectric on the backside at the second cavity, thereby forming holes on the back side; and
    plating or filling the holes by a metal.

16. A component carrier, comprising:
    a stack comprising at least one electrically conductive layer structure and/or at least one electrically insulating layer structure;
    at least one hole with straight sidewalls on a front side of the stack;
    at least one hole with tapering sidewalls on a back side of the stack;
    a cured patterned first photo-imageable dielectric on the front side of the stack;
    at least one cone-shaped hole on the back side of the stack;

a metal or metallized core having a first cavity, in which a semiconductor chip and/or a passive component is accommodated; and a through-hole passing through the metal or metallized core of the component carrier;

wherein the through-hole extending from the front side has sidewalls being at least partially covered with the cured first photo-imageable dielectric;

wherein an inner surface of the through-hole is plated or filled by a metal;

wherein the semiconductor chip or the passive component are mounted on a second photo-imageable dielectric on the back side of the stack or embedded in first photo-imageable dielectric.

17. The component carrier according to claim 16, further comprising at least one of the following features:

the at least one electrically conductive layer structure comprises at least one of the group consisting of copper, aluminum, nickel, silver, gold, palladium, and tungsten;

the at least one electrically insulating layer structure comprises at least one of the group consisting of resin, reinforced or non-reinforced resin, epoxy resin or Bis-maleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

the component carrier is shaped as a plate;

the component carrier is configured as one of the group consisting of a printed circuit board, and a substrate;

the component carrier is configured as a laminate-type component carrier.

18. The component carrier of claim 16, further comprising:

at least one cone-shaped hole on the front side of the stack;

wherein an inner surface of the at one cone-shaped hole on the front side of the stack is plated or filled with a metal.

19. The component carrier of claim 18, wherein the plated or filled cone-shaped hole on the front side of the stack contacts at least one of the passive component or the metal or metallized core.

20. A component carrier, comprising:

a stack comprising at least one electrically conductive layer structure and at least one electrically insulating layer structure;

a cured patterned first photo-imageable dielectric on a front side of the stack;

at least one cone-shaped hole on a back side of the stack;

a metal or metallized core having a first cavity, in which a semiconductor chip or a passive component is accommodated;

a through-hole passing through the metal or metallized core of the component carrier;

wherein the through-hole extends from the front side of the stack and has sidewalls being at least partially covered with the cured first photo-imageable dielectric;

wherein an inner surface of the through-hole is plated or filled by a metal;

wherein the semiconductor chip or the passive component is embedded in the at least one electrically insulating layer structure.

21. The component carrier according to claim 20, further comprising:

a cured patterned dielectric on the back side of the stack.

22. The component carrier according to claim 21, wherein the cured patterned dielectric on the backside is a thermal curing material or a second photo-imageable dielectric.

23. The component carrier according to claim 20, wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

24. The component carrier according to claim 20, wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

25. The component carrier according to claim 20, further comprising at least one of the following features:

the at least one electrically conductive layer structure comprises at least one of the group consisting of copper, aluminum, nickel, silver, gold, palladium, and tungsten;

the at least one electrically insulating layer structure comprises at least one of the group consisting of resin, reinforced or non-reinforced resin, epoxy resin or Bis-maleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide;

the component carrier is shaped as a plate;

the component carrier is configured as one of the group consisting of a printed circuit board, and a substrate;

the component carrier is configured as a laminate-type component carrier.

26. The component carrier of claim 20, further comprising:

at least one cone-shaped hole on the front side of the stack;

wherein an inner surface of the at least one cone-shaped hole on the front side of stack is plated or filled with a metal.

27. The component carrier of claim 26, wherein the plated or filled cone-shaped hole on the front-side of the stack contacts at least one of the passive component or the metal or metallized core.

* * * * *